US005541367A

United States Patent [19]
Swamy

[11] Patent Number: 5,541,367
[45] Date of Patent: Jul. 30, 1996

[54] PRINTED CIRCUIT BOARD HAVING A LAND WITH AN INWARDLY FACING SURFACE AND METHOD FOR MANUFACTURING SAME

[75] Inventor: N. Deepak Swamy, Austin, Tex.

[73] Assignee: Dell USA, L.P., Austin, Tex.

[21] Appl. No.: 332,026

[22] Filed: Oct. 31, 1994

[51] Int. Cl.$^6$ ............................................. H05K 1/18
[52] U.S. Cl. ..................... 174/260; 174/261; 361/767; 361/760; 361/808; 439/83; 257/734; 257/739; 29/840
[58] Field of Search ............................. 174/261, 250, 174/260; 361/767, 760, 777, 808; 439/83, 78; 257/739, 734; 29/839, 832, 840, 843

[56] References Cited

U.S. PATENT DOCUMENTS

| | | | |
|---|---|---|---|
| 4,254,448 | 3/1981 | Martyniak | 361/409 |
| 4,976,626 | 12/1990 | Dibble et al. | 439/67 |
| 5,203,075 | 4/1993 | Angulas et al. | 29/830 |
| 5,373,111 | 12/1994 | McClure et al. | 174/250 |
| 5,410,807 | 5/1995 | Bross et al. | 29/843 |

OTHER PUBLICATIONS

Printed Circuits Handbook, Clyde F. Coombs, Jr., McGraw–Hill Company, Third Edition pp. 12.11–12.13.

Primary Examiner—Laura Thomas
Attorney, Agent, or Firm—Henry Garrana; Michelle Turner

[57] ABSTRACT

A printed circuit board is provided having one or more lands formed upon the outer surface of the printed circuit board. Each land is adapted to receive a surface mount component and, specifically, leads extending from the surface mount component. Each land is fabricated having an inwardly facing exposed surface which, when the lead is placed upon the land, directs or channels the lead toward the center of the land to enhance interconnect accuracy of the lead to the land. Moreover, various configurations of solder are placed upon the land, wherein the solder can be deposited at select regions on the land or at a controlled thickness. Careful placement of solder helps ensure the lead, once placed, will not migrate or misalign from the land during subsequent reflow. Careful placement of solder helps minimize surface tension imbalance of the molten solder by assuring surface migration in a controlled direction to the middle of the land.

9 Claims, 5 Drawing Sheets

PRINTED CIRCUIT BOARD HAVING A LAND WITH AN INWARDLY FACING SURFACE AND METHOD FOR MANUFACTURING SAME

BACKGROUND OF THE INVENTION

1. Field of the Invention

This invention relates to a printed circuit board (PCB) and more particularly to a land formed upon the PCB having an inwardly facing surface, and a controlled thickness of solder placed upon at least a portion of the inwardly facing surface. During placement, the solder covered surface is configured to channel a surface mount component (SMC) lead to a middle portion of the land.

2. Background of the Relevant Art

PCBs or printed wiring boards (PWBs) are rigid or flexible, single, double or multi-layered boards having printed conductors placed upon or within the board material. A PCB is designed to receive separately manufactured electrical components and to interconnect those components into an overall circuit structure. The components comprise integrated or discrete circuits well known in the semiconductor art.

PCBs are manufactured by subtractive or additive processes from rigid copper-clad, epoxy-impregnated glass fiber laminate or phenolic-impregnated paper. Regardless of the base material used or the process by which printed conductors are formed, the desired outcome of PCB manufacture remains the same: to produce a dielectric structure having densely patterned printed wires arranged upon the dielectric outer surface or at one or more layers within the dielectric. The resulting overall structure provides a reliable mechanical and electrical support for components arranged thereon.

The technology used in forming a PCB as well as the packaged component arranged thereon has evolved over time. Initially, most components were packaged in large metal, glass and/or plastic material having sparsely spaced, thick (large cross-sectional) leads extending from the package material. To accommodate the thick, sparsely spaced leads, sockets or metal eyelets were fashioned within the PCB in registry with the leads. The thick leads and accommodating eyelets/sockets have given way to some extent to more densely spaced interconnect schemes.

Recent advances in integrated circuit fabrication have brought about packaged components having a hundred or more leads extending from the package. In order to place numerous components and connect dense leads from those components to the PCB, advances in interconnect are necessary. One such advancement involves the use of plated-through holes (PTHs) arranged upon the PCB. PTHs are patterned at small pitch distances across the PCB in registry with densely spaced, smaller cross-sectional leads. PTHs require a hole formed at least partially through the PCB with conductive plating deposited on the walls of the holes. The plated hole is covered with a solder material such that, during wave soldering or reflow, molten solder is drawn up around leads placed in the holes by capillary action to form a secure bond. PTHs are easier and less costly to form than metal eyelets and can receive thinner leads of lesser pitch. Accordingly, PTHs allow miniaturization of component-to-PCB interconnect.

More recently, PTH techniques have, in some respects, given way to an even more dense interconnect scheme often referred to as surface mount technology. Instead of drilling holes through the PCB and placing component leads through plated holes, surface mount "lands" are formed on the PCB surface only, and are configured to receive leads from a surface mount component (SMC). While PTH leads are smaller than leads inserted into metal eyelets or sockets, PTH leads must nonetheless be large enough to withstand the rigors of insertion. Since they need not be inserted into a hole, surface mount leads can be made much thinner then PTH leads and can therefore be placed at an even lesser pitch.

Compared to an equivalent PTH PCB, a typical surface mount PCB can be made 20 to 50 percent smaller. Most of the savings associated with manufacturing a surface mount PCB can be attributed directly to its smaller physical size. Additional cost savings arise from not having to drill the PCB and plate the inside surface of the drilled hole. A surface mount PCB also achieves a high frequency performance advantage over PTH PCBs. Not having to extend through a hole, surface mount leads are much shorter than PTH leads and therefore avoid added parasitic inductances and capacitances associated with longer leads.

In general, SMCs can be classified according to various lead configurations. SMCs can be either leaded or leadless. Leadless SMCs generally embody the lead as an exposed part of the edge or backside surface of the packaging material. A metalized material comprising the lead is formed generally flush with or slightly raised from the outer surface of the leadless package. Leadless SMCs which package an integrated circuit have often been referred to as leadless chip carriers. While leadless chip carriers allow shorter leads than leaded SMCs, leadless chip carriers nonetheless suffer from thermal mismatch at the interconnect joint during reflow soldering and operation. For example, ceramic of a leadless ceramic chip carrier has a considerably lower coefficient of thermal expansion (CTE) than counterpart leaded SMCs or leaded chip carriers. Instead of the interconnect joint being in direct thermal contact with the package material, leads of a leaded SMC are displaced from the package material to allow thermal matching to lands upon the PCB. If the leads are configured directly upon or embedded within the package, as in the leadless variety, then thermal stress during solder reflow and thermal energy generated from the package during operation may cause failure at the interconnect joint.

Leaded SMCs have risen in popularity as an alternative to leadless SMCs partly due to CTE problems associated with leadless SMCs. The leads of a leaded SMC are generally classified in three groups: gull-wing, j-bend and i-lead arrangements. Small-outline SMCs, tape carrier SMCs leaded chip carrier SMCs and quadpack SMCs all utilize various gull-wing, j-bend and i-lead arrangements.

Not only do leaded SMCs overcome CTE problems of leadless SMCs, but can in some instances achieve a thinner lead of lesser pitch than leadless SMCs. Leads from, for example, a quadpack or a tape carrier package can achieve pitch distances of approximately 0.02 in. Densely patterned leads make leaded SMCs well suited for large integrated circuits having a hundred or more leads such as microprocessors or microcontrollers. However, to achieve the necessary pitch density, the lead frame must be manufactured from thin metal stock, making the leads extremely fragile. The thin leads with fine pitch distances therebetween are often bent or deformed during handling. When placed upon the PCB, the bent or mishandled leads may not come in registry with their respective lands. Additionally, the thin leads can readily flex or bend when placed upon respective lands.

After the leads are brought in contact with lands and during reflow operation, the thin leads can further move from the desired (or placed) position. Surface tension of the molten solder can readily pull a thin lead of a leaded SMCs to a position of minimum solder surface energy. If the land is poorly designed and solder placed on the land surface is not formed at a controlled thickness, then solder surface energy gradient may exist which forces molten solder to carry the lead from the land position to a position near the edge of the land or completely off the land.

Movement of a lead from the land, caused either by physical contact of the lead to the land or subsequent reflow, will result in an open circuit at the interconnect position. Additionally, if two leads are misaligned and directed toward one another, a short circuit will occur. It is therefore important to improve placement accuracy of lead-to-land interconnect, not only during placement but also during subsequent solder reflow.

SUMMARY OF THE INVENTION

The problems outlined above are in large part solved by an improved land configuration which allows for channeling of a respective lead to the center of the land during placement, and further channeling, if necessary, of the lead during subsequent reflow. The land described herein has an arcuate upper surface with an inwardly facing surface. The upper surface is adapted to receive a lead of a leaded SMC and direct that lead to a middle portion of the land during placement. When brought in contact with the land, the thin lead will flex along the inwardly facing, arcuate upper surface such that the lead resides, after placement, at or near the center of its respective land.

To aid in channeling the lead during reflow, a layer of solder is selectively placed along two strips near opposing edges of each land with solder absent from the center of the land, according to one embodiment. The solder thusly arranged is preferably deposited using electroplating or electrolytic processes. According to another embodiment, a controlled thickness of solder is placed entirely across the land upper surface and is preferably formed using an electroless process. The electroless process allows for a thinner deposited layer of solder than counterpart electroplated solder. The thinner solder can be more easily and more quickly reflowed to avoid surface tension imbalances which often occur with thicker, unevenly placed solder.

The land and land upper surface is configured according to a method in which the number of process steps and phototool ("masks") are minimized. Additionally, the land upper surface is formed during normal PCB manufacturing sequence. As defined herein, each land is formed at or near a terminating end of a lithography formed printed conductor. The printed conductor at the terminating end exists on one or both exposed, opposing surfaces of the PCB and can be routed to various layers within a multi-layered PCB. The land, in its preferred form, accommodates and fixedly secures a distal end of a lead from a leaded SMC having thin leads of small pitch such as those extending from, for example, tape carrier packages, quadpacks, leaded chip carriers, and small-outline integrated circuit packages (SOICs). The land overcomes problems of a misaligned leads arising during placement and reflow and, accordingly, can accommodate either gull-wing, j-bend or i-lead arrangements.

Broadly speaking, the present invention contemplates a printed circuit board. The printed circuit board comprises a circuit board substrate having opposed surfaces and an elongated conductor extending across a portion of at least one of the opposed surfaces. The printed circuit board further comprises a metal layer formed on a portion of one end of the elongated conductor. The metal layer includes an arcuate upper surface facing inward toward a midline of the metal layer. The printed circuit board further comprises a solder layer placed upon at least a portion of the metal layer upper surface.

The metal layer upper surface is concave along a cross-section of the metal layer. Depending upon the geometric configuration of the land, the upper surface of the metal can include a grove extending along the midline of the entire distance of the metal layer. As defined herein, "midline" is a line extending parallel to the elongated conductor at one end of the conductor. If the land at the end of the conductor is elongated in the same direction as the conductor adjacent the land, then the midline extends in that direction central to the metal which forms the land, i.e., the midline is spaced between the edges of the metal layer and the upper and lower surfaces of the metal layer deposited at the end of the elongated conductor.

The present invention further contemplates a method for fabricating a printed circuit board land. The method comprises providing a circuit board substrate with a first metal layer formed across opposed surfaces of the substrate. A conductive second metal layer is deposited upon a select portion of the first metal layer. The second metal layer extends along the midline. The midline, as described above, extends parallel to and is spaced centrally between opposed sides of the second metal layer. An etch window is formed down to a portion of the second metal layer. The etch window extends over the midline and laterally from the midline. The second metal layer is then etched at a faster rate nearer the midline then at areas laterally spaced from the midline. Etch rate variability can therefore form an upper surface of the second metal layer that is concave along a cross-section of the second metal layer. A layer of solder is then deposited across at least a portion of the upper surface of the second metal layer.

The etch window is formed using an electroplating process. A layer of etch resist material is electroplated upon the second metal and thereafter imaged and developed to form two strips of etch resist formed upon the upper surface of the second metal near the edges of the second metal —i.e., in an area laterally spaced outward from a position directly above the midline. The etch window is thereby formed between the etch resist strips directly above the midline and laterally disposed therefrom a distance less than a width between the opposed sides of the second metal layer. The etch resist material preferably comprises a solder of tin and lead.

The present invention further contemplates a method for forming an interconnect between a circuit board land and a lead of a surface mount component. The method comprises providing a circuit board substrate with a first metal layer formed across a surface of the substrate. A second metal layer is deposited upon select portions of the first metal layer. An etch window is formed centrally disposed over the second metal layer between a pair of etch resist strips formed upon the second metal layer. A portion of the second metal layer is removed directly beneath the etch window thereby leaving a depression within the second metal layer having an arcuate surface. A solder of substantially uniform thickness is deposited across the second metal layer to form a printed circuit board land. A lead of a surface mount component can then be positioned over the land. By exerting abutting force of the lead toward the land, the lead is channelled into the lowest portion of the depression by a reciprocating movement of the lead along the arcuate exposed surface. The solder is then reflowed across the lead to fixedly engage the lead upon the land.

BRIEF DESCRIPTION OF THE DRAWINGS

Other objects and advantages of the invention become apparent upon reading the following detailed description and upon reference to the accompanying drawings.

While the invention is susceptible to various modifications and alternative forms, specific embodiments thereof are shown by way of example in the drawings and will herein be described in detail. It should be understood, however, that the drawings and detailed description thereto are not intended to limit the invention to the particular forms disclosed, but on the contrary, the intention is to cover all modifications, equivalents and alternatives falling within the spirit and scope of the present invention as defined by the appended claims.

DETAILED DESCRIPTION OF THE INVENTION

Figure 1:
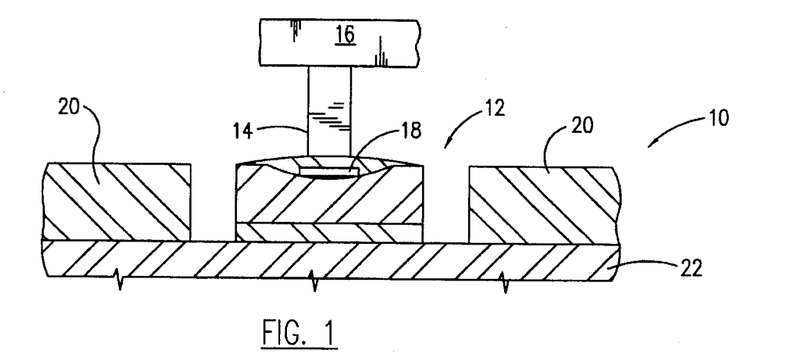
FIG. 1 is a cross-sectional view of a partial PCB embodying a land formed according to the present invention with a lead of a SMC reflow soldered upon the land.

Turning now to FIG. 1, a partial cross-sectional view of a PCB 10 is shown. PCB 10, in its final state of development, as described hereinbelow, includes a land 12 formed at terminal ends of printed conductors arranged at least partially upon an outer surface of a single layer, double layer or multi-layered PCB 10. A plurality of lands 12 are formed on an exposed surface of PCB 10 in registry with respective leads 14. Leads 14 extend from a SMC according to leaded SMC design. SMC 16 embodies a packaged discrete or integrated circuit with terminal ends of the embodied discrete or integrated circuit connected to one end of lead 14. The other end of lead 14 is brought in contact with the upper surface of land 12, as shown by reference numeral 18.

Surrounding each land 12 is a layer of solder mask material 20. Solder mask 20 as well as each land 12 are patterned across a circuit board substrate 22. Circuit board substrate 22 is made of a dielectric base material. A suitable base material includes epoxy-impregnated glass fiber laminate or phenolic impregnated paper. Details regarding various types of PCBs 10, SMCs 16 and fabrication of land 12 as well as solder mass 20 are provided hereinbelow.

Figure 2:
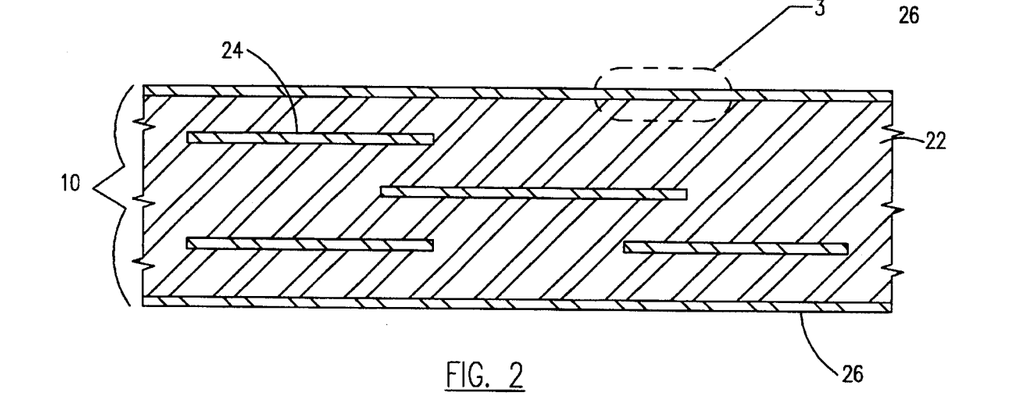
FIG. 2 is a cross-sectional view of a partial PCB at an early stage of development after which it will be developed as shown in FIGS. 3–12B according to principles and various embodiments of the present invention.

FIG. 2 is a cross-sectional view of a partial PCB 10 during an early stage of development. PCB 10 preferably includes multi-layers of conductive elements 24 formed within the dielectric substrate 22. Conductive elements 24 extend either as a contiguous plane across the entire PCB or as spaced, co-planar elongated trace conductors. Various levels of conductive elements 24 can be interconnected using PTH techniques or vias (blind or buried vias) fashioned through at least a portion of PCB 10. The PTHs and/or vias (not shown) provide interconnection between printed conductors formed on the outer surface of PCB 10 and conductive elements 24 contained within PCB 10.

A layer of conductive material 26, shown at the upper and lower surfaces of FIG. 2 are to be patterned in subsequent steps to form a plurality of printed conductors arranged across the front and backside surfaces. The printed conductors are formed by transferring an image from a mask using photoprinting or photolithography techniques. The layer of conductive material is metallic, and preferably copper. Copper is generally formed using an electroless process and, more specifically, derives copper from, for example, an alkaline chelated copper reducing solution which deposits thin copper, anywhere from 0.0001 to 0.01 inches on the surface of substrate 22 as well as in holes formed through substrate 22.

Figure 3:
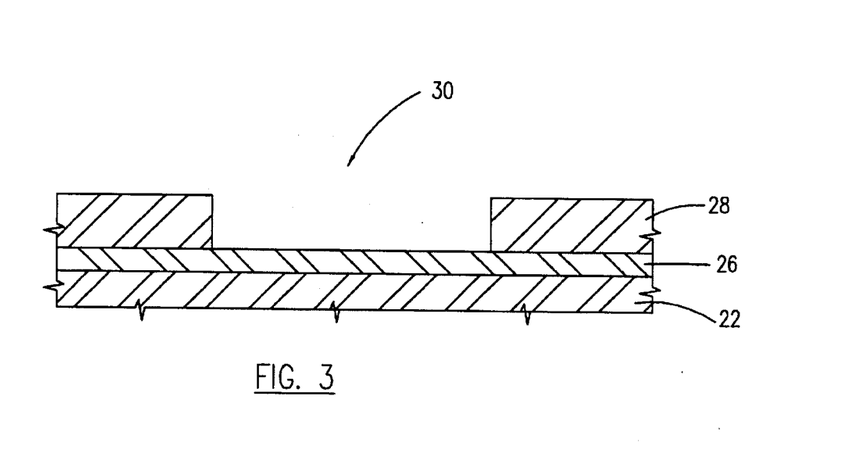
FIG. 3 is a detailed cross-sectional view along area 3 of FIG. 2 at a development stage subsequent to that shown in FIG. 2.

After conductive material 26 is formed, a photosensitive resist ("photoresist") 28 is deposited across material 26 as shown in FIG. 3. Photoresist 28 can be placed according to conventional screening techniques or as liquid or dry film. Depending upon line and space resolution requirements, panel size and run lengths, a suitable resist-application process is chosen. Composition of photoresist 28 includes any resists which polymerizes or hardens in the presence of light.

Placement of a mask in proximity to the deposited resists 28 and imaging from the mask to the resist using light, allows formation of select hardened areas. Areas which are not hardened are etched and removed leaving a window 30 between developed material 28 to conductive material 26.

Figure 4:
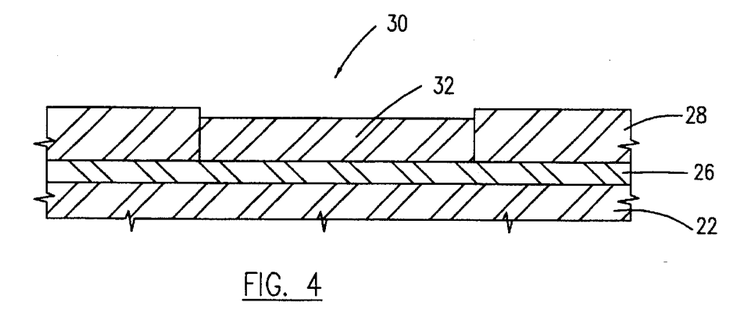
FIG. 4 is a detailed cross-sectional view along area 3 of FIG. 2 at a development stage subsequent to that shown in FIG. 3.

FIG. 4 is a detailed cross-sectional view of area 3 at a stage of development subsequent to the step of FIG. 3. Specifically, FIG. 4 illustrates pattern plating of second conductive material 32 within window area 30 and upon first conductive material 26. Like first conductive material 26, second conductive material is metallic and preferably copper. Pattern plating involves a process wherein only the desired circuit patterns and holes within window areas receive metal layer 32. Pattern plating therefore adds conductive material 32 after imaging of photoresist 28. Converse to pattern plating, panel plating adds conductive material 32 across the entire surface before imaging. Pattern plating generally involves fewer steps and less etching of conductive material 32. Additionally, pattern plating minimizes undercut at the etch boundaries to achieve greater circuit density. A comparison of panel plating versus pattern plating is generally described in Combs, *Printed Circuit Handbook* (McGraw-Hill, Inc. 1988) pp. 12.11–12.13.

Figure 5:
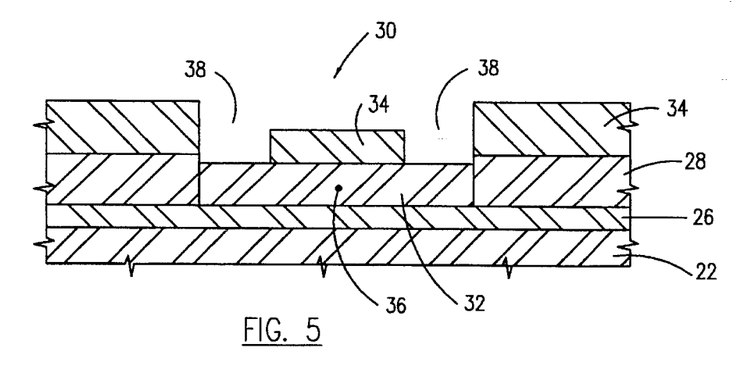
FIG. 5 is a detailed cross-sectional view along area 3 of FIG. 2 at a development stage subsequent to that shown in FIG. 4.

Referring now to FIG. 5, a development stage subsequent to that shown in FIG. 4 is illustrated. A second photoresist layer 34 is placed upon the entire topography. After image and develop, second photoresist layer 34 remains on first photoresist layer 28 and a central portion of conductive material 32. Similar to first photoresist 28, second photoresist 34 is placed using a dry or liquid-based material or a screened process. Second photoresist 34 is imaged using a mask which is the same mask previously used to image first photoresist 28 ored with a negative shrink of that mask.

FIG. 5 illustrates, after image and develop, a portion of second photoresist 34, denoted as 34a, residing within window 30 and partially over second conductive material 32. Photoresist 34a is centrally disposed within window 30 and extends laterally an equal distance from a midline 36. Midline 36 extends along a central axis through second conductive material 32 and perpendicular to the cross-sectional plane of FIG. 5, as well as all other cross-sectional views herein. Photoresist 34a is spaced above midline 36 and extends laterally from midline 36 prior to it reaching the edges of second conductive material 32. Thus, photoresist 34a is spaced from photoresist 34 to cause an opening into which an etch resist material 40 is placed in the step shown in FIG. 6.

Figure 6:
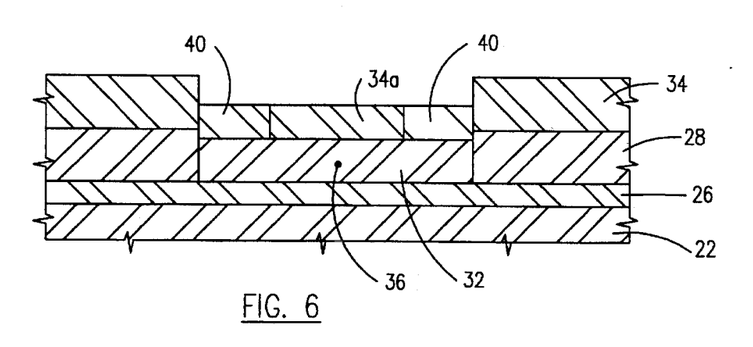
FIG. 6 is a detailed cross-sectional view along area 3 of FIG. 2 at a development stage subsequent to that shown in FIG. 5.

Etch resist material 40 is dissimilar from first and second photoresists 28 and 34/34a. Contrary to photoresist materials 28, 34/34a, etch resist 40 is generally conductive and non-sensitive to light. Etch resist 40 is generally placed using an electroplating or electrolytic process. A popular etch resist composition includes lead and tin in an approximate ratio of 63% tin (Sn) and 37% lead (Pb). Other types of etch resists include, for example, nickel, platinum, silver or a combination thereof.

Figure 7:
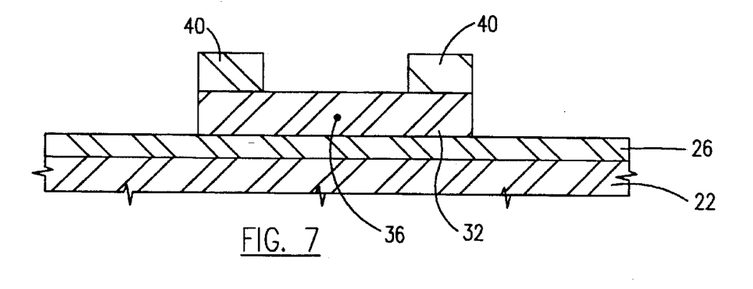
FIG. 7 is a detailed cross-sectional view along area 3 of FIG. 2 at a development stage subsequent to that shown in FIG. 6.

Etch resist 40 adheres only to exposed upper surfaces of conductive material, such as second conductor 32. Etch resist 40 therefore does not plate upon photoresists, either first photoresist 28 or second photoresist 34. After etch resist 40 is in place, FIG. 7 illustrates a subsequent step of stripping both first and second resists 28 and 34. Photoresists 28 and 34 removed using various solvent-based stripping formulations which rapidly defuse into the bulk of the polymerized resist structure. Popular solvent-based formulations include, for example, methylene chloride and methyl alcohol. The above formulations are merely examples of solutions used to remove polymerized photoresists. There may, of course, be additional solutions which may work equally well, as would be known to a skilled artisan.

Figure 8A:
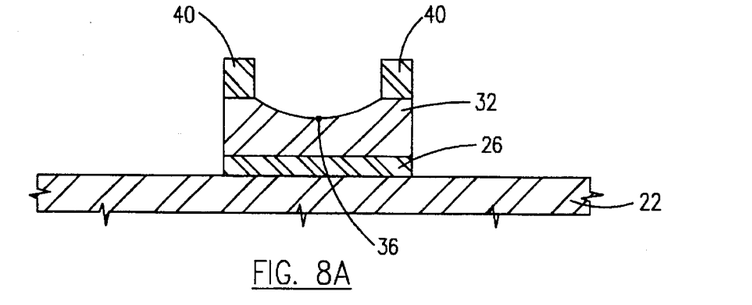
FIG. 8A is a detailed cross-sectional view along area 3 of FIG. 2 at a development stage, according to one embodiment, subsequent to that shown in FIG. 7.

Removal of first and second photoresists 28 and 34 provides an exposed upper surface of first conductive material 26 and second conductive material 32. In a subsequent step shown in FIG. 8A, the exposed first and second conductive layers 26 and 36 are etched using an etching solution such as, for example, ammonium hydroxide, ammonium chloride, sodium chlorite, ammonium bicarbonate, ammonium phosphate or ammonium nitrate. Other etch compositions may also be used to remove a copper conductive material, as would be known to a person skilled in the art. Importantly, second metal 32 is of greater thickness than first metal 26. Accordingly, while first metal 26 is completely removed in its exposed regions, second conductive material 32 is not. Second conductive material 32 is etched between etch resist strips 40, wherein etch resist 40 is substantially impervious to the etch solution. Etch-back of second conductive material 32 presents an arcuate upper surface which faces inward toward midline 36. In the cross-section of FIG. 8A, upper surface 42 is shown concave between etch resist strips 40.

Figure 8B:
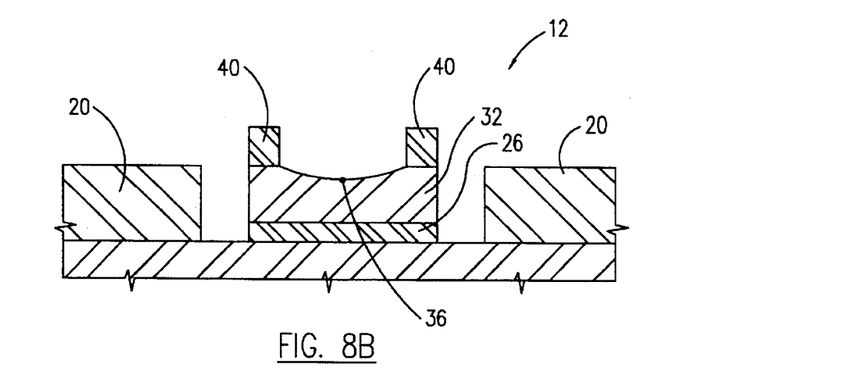
FIG. 8B is a detailed cross-sectional view along area 3 of FIG. 2 at a development stage subsequent to that shown in FIG. 8A.

FIG. 8B illustrates completion of land 12 surrounded by a layer of solder resist 20. Solder resist 20 functions to restrict molten solder pick up or flow to areas of PCB 10 that are not covered by solder resist 20. Solder resist 20 is therefore used across the exposed surfaces of PCB 10 except for areas needing interconnect to leads from a packaged, overlying electrical component. Thus, windows are formed within solder resist 20 to allow exposed areas of interconnection, such as the upper surface of one or more lands 12. FIG. 8B illustrates one embodiment of a completed land 12. Land 12, shown in FIG. 8B, includes second metal 32 having an arcuate, inwardly disposed upper surface 42 arranged upon first metal 26 between etch resist strips 40. Etch resist 40 is a solder, preferably a combination of tin and lead alloy. As will be described below, the configuration of FIG. 8B allows channeling of a component lead toward midline 36 and subsequent reflow of etch resist (solder) 40 down into the depression formed by etch back of second conductive material 32.

Figure 9:
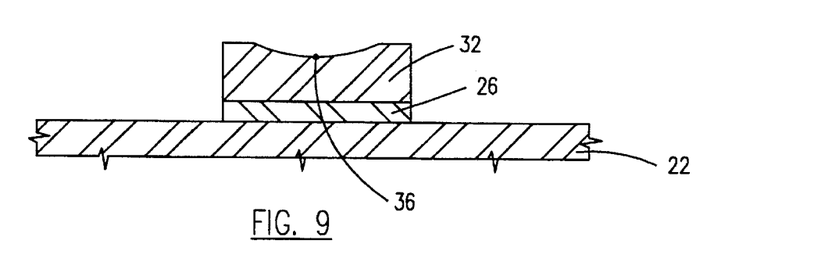
FIG. 9 is a detailed cross-sectional view along area 3 of FIG. 2 at a development stage, according to another embodiment, subsequent to that shown in FIG. 7.
Figure 10:
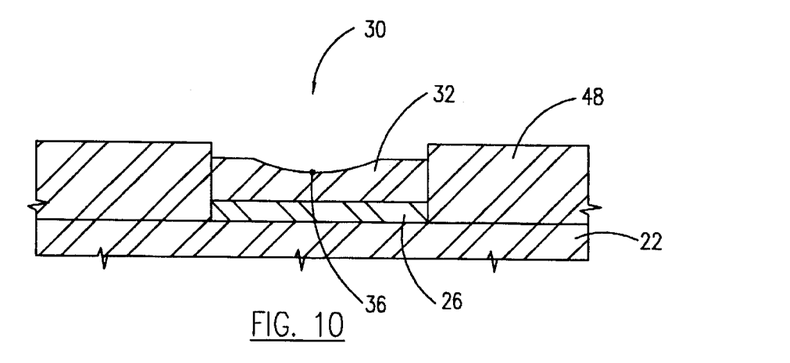
FIG. 10 is a detailed cross-sectional view along area 3 of FIG. 2 at a development stage subsequent to that shown in FIG. 9.

Instead of retaining solder 40 in a laterally displaced position from midline 36 as shown in FIG. 8B, FIG. 9 illustrates an alternative embodiment in which a more controlled, evenly displaced, thinner layer of solder can be formed entirely across the upper surface 42. FIG. 9 illustrates a process step subsequent to FIG. 7 whereby etch resist 40 is removed using a resist material which solubilizes the etch resist composition while retaining upper surface 42. Subsequent step (not shown) can be used to remove unwanted, exposed conductive material 26. Etch resist 40 is selected from a composition which is impervious to the solution which removes conductive layers 26 and 32, but can be removed by a solution which does not remove layers 26 and 32. Once etch resist 40 is removed, a third photoresist layer 48 is deposited across the upper typography of PCB 10, imaged using a mask identical to that used to image first photoresist 28 in FIG. 3, and thereafter developed to represent window 30. Third photoresist 48 is made of the same chemical composition and is photosensitive similar to first and second photoresists 28 and 34.

Figure 11:
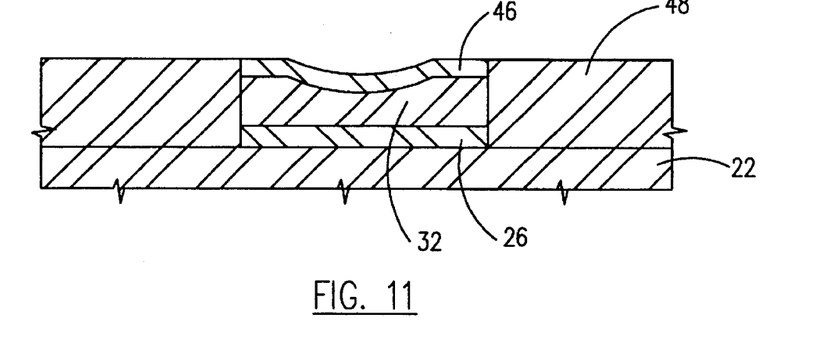
FIG. 11 is a detailed cross-sectional view along area 3 of FIG. 2 at a development stage subsequent to that shown in FIG. 10.

FIG. 11 illustrates a subsequent step in which an etch resist 46 is deposited within window 30 between polymerized third photoresist 48. Etch resist 46 conforms, using an electroless process across arcuate surface 42 as well as the surface under which the previous etch resist 40 resided. Electroless deposition of etch resist 46 is performed in the additive process using a chemical metallic deposition and is done without the assistance of an external supply of electrons. Electroless deposition follows a principal by which the PCB is immersed in an aqueous solution which is composed of water-soluble metallic compound, a metallic complexing or chelating agent, a reducing agent, an agent capable of adjusting pH agents, and a stabilizing agent. The metallic compound preferably is a solder of tin and lead alloy which can be advantageously deposited to very low thickness, a lesser thickness than that achievable by electroplating or electrolytic processes. Etch resist (solder) layer 46 can be deposited to a thickness less than 0.0002 inches as a conformal thin layer across the entire exposed surface of second metal 32. By using a thin conformal layer, etch resist 46 retains the underlying arcuate configuration and inward directed surface of second metal 32.

Figure 12A:
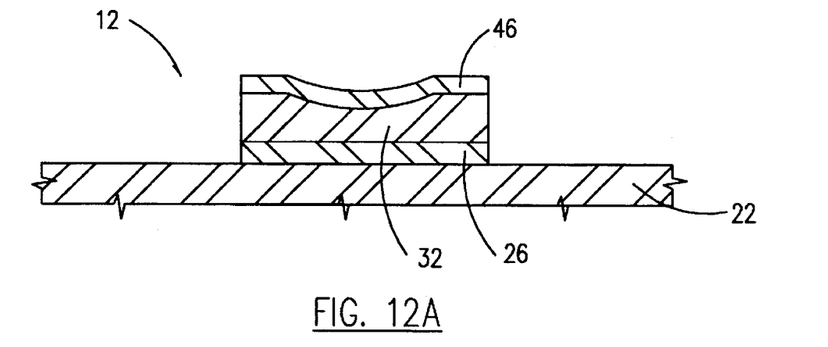
FIG. 12A is a detailed cross-sectional view along area 3 of FIG. 2 at a development stage subsequent to that shown in FIG. 11.
Figure 12B:
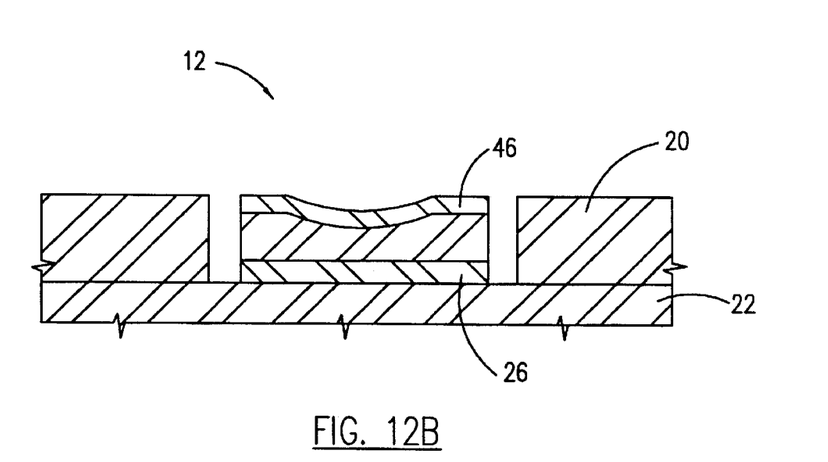
FIG. 12B is a detailed cross-sectional view along area 3 of FIG. 2 at a development stage subsequent to that shown in FIG. 12A.

As shown in FIG. 12A, etch resist 46 is retained while polymerized third photoresist layer 48 is removed. The resulting land 12 is surrounded by an imaged and developed solder mask 20, shown in the subsequent step of FIGS. 12B. The completed embodiments of land configurations 12 are shown in FIGS. 8B and 12B. The difference between each embodiment is the placement of etch resist (solder) upon the upper surface 42 of second conductive material (second metal) 32. Solder 40 is relatively thick as compared to solder 46 and does not extend entirely across upper surface 42. A thinner, and more controllable process for placing solder 46 allows a tighter thickness control necessary to ensure that misalignment is minimized during reflow operations. Arcuate surface 42 helps ensure accurate placement of a component lead to the center of land 12, while a conformal, thin solder 46 helps assure that placement accuracy is maintained during subsequent reflow.

Figure 8C:
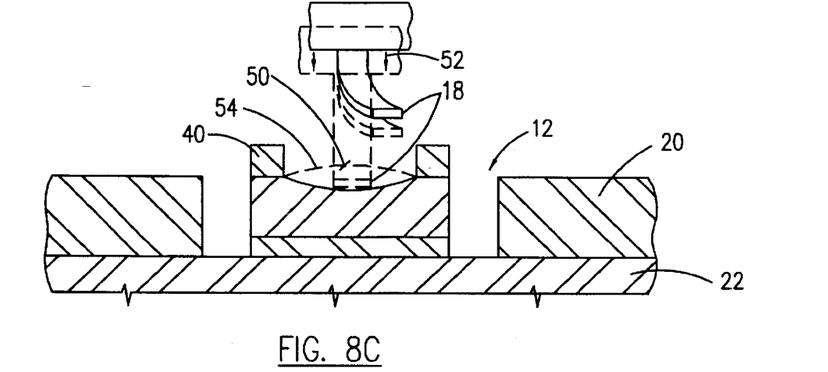
FIG. 8C is a detailed cross-sectional view of a land shown in the embodiment of FIG. 8B having an upper surface adapted to laterally channel a lead of a SMC to the center of the land.
Figure 12C:
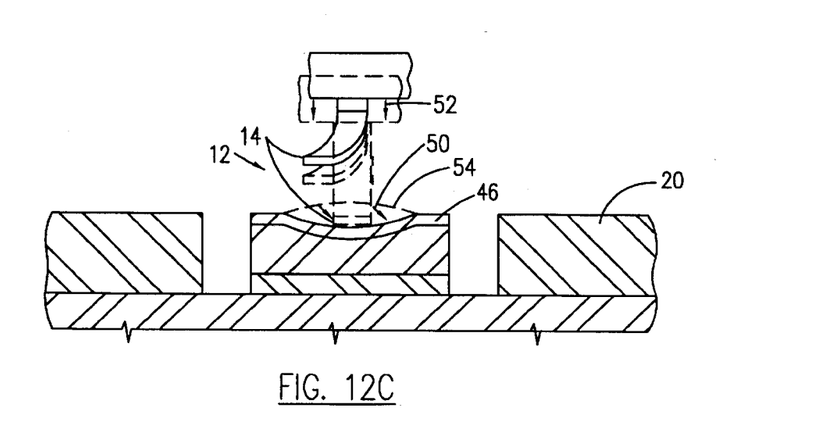
FIG. 12C is a detailed cross-sectional view of a land shown in the embodiment of FIG. 12B having an upper surface adapted to laterally channel a lead of a SMC to the center of the land.

Referring to FIGS. 8C and 12C, placement of lead 14 upon land 12 is illustrated for both embodiments-one embodiment having solder 40 partially covering second conductive material 32 and the other embodiment showing a thinner solder 46 entirely covering second conductive material 32. In either instance, a thin, somewhat flexible SMC lead 14 is channelled along surface 42 toward midline 36, as shown by arrows 50. As SMC 16 is moved downward as shown by arrows 52, lead 12 is flexed (shown in phantom) to its final position at the center of land 12. After lead 12 has been placed, it is then fixed in position by reflowing solder 40 or 46 to a new solder position 54 over the distal end of lead 14.

Figure 13:
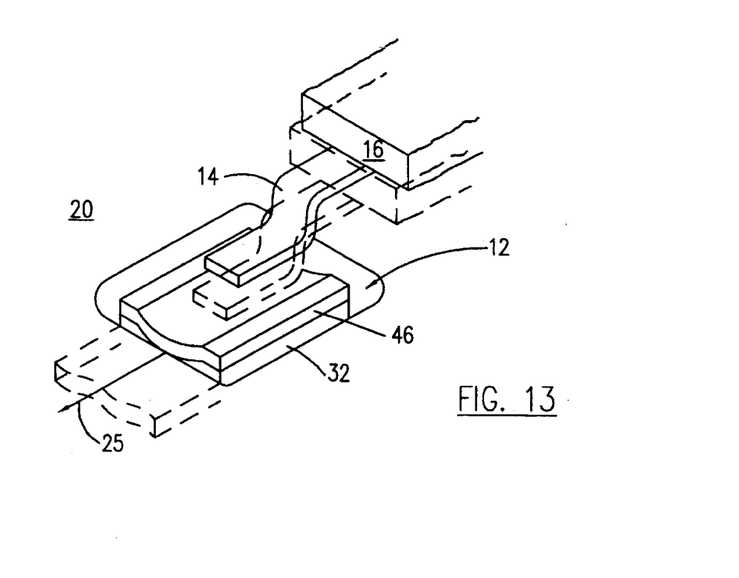
FIG. 13 is a perspective view of a SMC lead vertically placed into a depression formed in the upper surface of the land.

FIG. 13 illustrates a perspective view of a SMC lead 14 vertically placed into the center of land 12 at the base of a depression formed in the upper surface of land 12. Lead 14 is channelled toward midline 36 of land 12 along the arcuate upper surface of solder 46. Land 12 is surrounded by solder mask 20 which covers patterned conductors 26a formed from first conductive material 26. Select patterned conductors 26a terminate as lands 12. Each land is fashioned having a concave cross-section with a groove extending along midline 36 parallel to the axis formed along elongated conductor 26a at one end of the conductor (the end on which land 12 is formed).

It will be appreciated to those skilled in the art having the benefit of this disclosure that this invention is capable of applications with numerous types of surface mount electrical components. It is understood that more than one electrical component can be configured upon the PCB, each component having surface mount leads extending downward in registry with a respective land formed upon the PCB. Furthermore, it is to be understood that the form of the invention shown and described is to be taken as presently preferred embodiments. Various modifications and changes may be made without departing from the spirit and scope of the invention as set forth in the claims. It is intended that the following claims be interpreted to embrace all such modifications and changes and, accordingly, the specification and drawings are to be regarded in an illustrated rather than a restricted sense.

What is claimed is:

1. A printed circuit board comprising:

a circuit board substrate having opposed surfaces;

an elongated conductor extending across a portion of at least one of said opposed surfaces;

a metal layer pattern plated on a portion of one end of said elongated conductor, said metal layer having an arcuate upper surface facing inward toward a midline of said metal layer; and a solder layer placed upon at least a portion of the metal layer upper surface.

2. The printed circuit board as recited in claim 1, wherein said metal layer comprises copper.

3. The printed circuit board as recited in claim 1, wherein said solder layer comprises tin and lead.

4. The printed circuit board as recited in claim 1, wherein the metal layer upper surface is concave along a cross section of said metal layer.

5. The printed circuit board as recited in claim 1, wherein said upper surface comprises a gap formed within said solder layer, wherein said gap constructs a groove extending along the midline the entire distance of said metal layer.

6. The printed circuit board as recited in claim 1, wherein the midline is parallel to an axis formed along the elongated conductor at one end of said conductor.

7. The printed circuit board as recited in claim 1, wherein said solder layer is formed by an electroless process entirely across the metal layer upper surface to a thickness less than said metal layer.

8. A printed circuit board fabricated by a method compromising:

providing a circuit board substrate with a first metal layer formed across opposed surfaces of said substrate;

depositing a conductive second metal layer upon a select portion of said first metal layer, said second metal layer extending along a midline parallel to and spaced centrally between opposed sides of said second metal layer;

forming an etch window to a portion of said second metal layer, said etch window extending over and laterally from said midline;

etching said second metal layer at a faster rate nearer said midline than at areas laterally spaced from said midline to form an upper surface of said second metal layer that is concave along a cross section of said second metal layer; and depositing a layer of solder across at least a portion of the upper surface of said second metal layer.

9. An interconnect formed by a method comprising:

providing a circuit board substrate with a first metal layer formed across a surface of said substrate;

depositing a second metal layer upon select portions of said first metal layer;

forming an etch window centrally disposed over said second metal layer between a pair of etch resist strips formed upon said second metal layer;

removing a portion of said second metal layer directly beneath said etch window thereby leaving a depression within said second metal layer having an arcuate upper surface;

depositing solder of substantially uniform thickness across said arcuate upper surface to form a printed circuit board land having an arcuate exposed surface;

positioning a lead of a surface mount component over said land;

exerting motive force upon said lead toward said land causing said lead to channel into said depression by a reciprocating movement of said lead along said archive exposed surface; and reflowing said solder across said lead to fixedly engage said lead upon said land.

* * * * *